United States Patent
Han et al.

(10) Patent No.: US 7,468,887 B2
(45) Date of Patent: Dec. 23, 2008

(54) PLASMA DISPLAY DEVICE

(75) Inventors: Chan-Young Han, Suwon-si (KR); Seung-Il Ha, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 208 days.

(21) Appl. No.: 11/132,155

(22) Filed: May 17, 2005

(65) Prior Publication Data
US 2005/0259401 A1  Nov. 24, 2005

(30) Foreign Application Priority Data

May 18, 2004 (KR) ........................ 10-2004-0035144
Apr. 18, 2005 (KR) ........................ 10-2005-0031870

(51) Int. Cl.
H05K 7/20 (2006.01)
H01L 23/34 (2006.01)
H01K 1/58 (2006.01)

(52) U.S. Cl. ................. 361/719; 361/710; 257/718; 165/80.3; 174/16.3; 313/33; 313/46

(58) Field of Classification Search ........... 361/687, 361/710, 719; 257/718–719, 712; 165/80.3; 174/16.3

See application file for complete search history.

(56) References Cited

U.S. PATENT DOCUMENTS

| 5,844,312 | A | 12/1998 | Hinshaw et al. | |
|---|---|---|---|---|
| 6,044,899 | A | 4/2000 | Langley et al. | |
| 6,798,661 | B1 | 9/2004 | Barsun et al. | |
| 2001/0004546 | A1 * | 6/2001 | Tobita et al. | 438/519 |
| 2001/0024198 | A1 * | 9/2001 | Oishi et al. | 345/204 |
| 2004/0085737 | A1 | 5/2004 | Choi et al. | |
| 2005/0051888 | A1 | 3/2005 | Kim | |
| 2005/0124221 | A1 * | 6/2005 | Lin | 439/620 |
| 2006/0158853 | A1 * | 7/2006 | Jeong | 361/704 |

(Continued)

FOREIGN PATENT DOCUMENTS

CN   1199505 A   11/1998

(Continued)

OTHER PUBLICATIONS

Korean Patent Abstracts, Publication No. 1020000021081 A, dated Apr. 15, 2000, in the name of Dong Yeop Oh.

(Continued)

*Primary Examiner*—Jayprakash N Gandhi
*Assistant Examiner*—Zachary M Pape
(74) *Attorney, Agent, or Firm*—Christie, Parker & Hale, LLP

(57) ABSTRACT

A plasma display device that diversifies heat dissipating paths of integrated circuit modules in a circuit board assembly, thereby enhancing heat dissipation of the integrated circuit modules. The plasma display device includes a plasma display panel, a chassis base on which the plasma display panel is attached and supported, integrated circuit modules that are mounted on the circuit board assembly on an opposite side of the chassis base to the plasma display panel, and heat sinks, each being attached to one side of each of the integrated circuit modules to dissipate heat therefrom. The heat sink is formed such that one end thereof extends to come in contact with the chassis base.

14 Claims, 9 Drawing Sheets

U.S. PATENT DOCUMENTS

2006/0268525 A1* 11/2006 Jeong .................... 361/719

FOREIGN PATENT DOCUMENTS

| CN | 1494135 A | 5/2004 |
| EP | 1 006 505 A2 | 6/2000 |
| JP | 7-322171 | 12/1995 |
| JP | 10-133782 | 5/1998 |
| JP | 10-260641 | 9/1998 |
| JP | 10-303580 | 11/1998 |
| JP | 2000-338904 | 12/2000 |
| JP | 2001-13883 | 1/2001 |
| JP | 2001-265245 | 9/2001 |
| JP | 2002-351346 | 12/2002 |
| JP | 2003-108017 | 4/2003 |
| JP | 2004-126151 | 4/2004 |
| JP | 2005-331945 * | 12/2005 |
| KR | 2000-0021081 | 4/2000 |
| KR | 2002-0021880 | 3/2002 |
| KR | 2003-0093750 | 12/2003 |
| KR | 10-2004-0080949 | 9/2004 |

OTHER PUBLICATIONS

Korean Patent Abstracts, Publication No. 1020040080949 A, dated Sep. 20, 2004, in the name of Haruo Koizumi et al.
Korean Patent Abstracts, Publication No. 1020030093750 A; Date of Publication: Dec. 11, 2003 in the name of Nam Seong Jung et al.
Korean Patent Abstracts, Publication No. 1020020021880 A; Date of Publication: Mar. 23, 2002 in the name of Je Seok Jung et al.
Patent Abstracts of Japan, Publication No. 2001-265245, Date of Publication: Sep. 28, 2001 in the name of Toshiji Oishi et al.
Patent Abstracts of Japan, Publication No. 2001-013883, Date of Publication: Jan. 19, 2001 in the name of Toyoshi Kawada et al.
Patent Abstracts of Japan, Publication No. 2000-338904, Date of Publication: Dec. 8, 2000 in the name of Toshiji Oishi et al.
Patent Abstracts of Japan, Publication No. 7-322171, Date of Publication: Dec. 8, 1995 in the name of Fujitsu General Ltd.
Patent Abstracts of Japan, Publication No. 2002-351346; Date of Publication: Dec. 6, 2002; in the name of Takuya Takaoka.
U.S. Office action dated Jun. 24, 2008, for related U.S. Appl. No. 11/943,548, indicating relevance of U.S. Patents and U.S. Publications listed in the IDS filed Jul. 11, 2008.
Patent Abstracts of Japan, Publication No. 2004-126151, dated Apr. 22, 2004, in the name of Manabu Akagi.

* cited by examiner

PLASMA DISPLAY DEVICE

CROSS-REFERENCES TO RELATED APPLICATION

This application claims priority to and the benefit of Korean Patent Application No. 10-2004-0035144 filed on May 18, 2004 and Korean Patent Application No. 10-2005-0031870 filed on Apr. 18, 2005, in the Korean Intellectual Property Office, the entire disclosures of which are incorporated herein by reference.

BACKGROUND OF THE INVENTION

1. Technical Field

The present invention relates to a plasma display device and, more particularly, to a plasma display device that can efficiently dissipate heat from switching elements or integrated circuit modules arranged on circuit board assemblies.

2. Description of the Related Art

Generally, a plasma display panel (hereinafter referred to as a PDP) is a display panel in which vacuum ultraviolet rays generated by gas discharge in discharge cells excite phosphors to produce images. The PDP has display configurations, including superior display capacity, brightness, contrast, and a wide viewing angle. Further, it may be lightweight, thin, and have a large screen.

A plasma display device according to the related art has a PDP that displays images, a chassis base that supports the PDP, a plurality of driving circuit boards that are provided on the chassis base to face the PDP, and a case that houses the PDP, the chassis base, and the driving circuit boards.

The case has a front cover that is disposed in front of the PDP and a back cover that is disposed behind the PDP. Generally, the front cover and the back cover can be assembled to each other.

The circuit board assemblies mounted on the chassis base includes a power supply board, an image processing board, a logic board, an address buffer board, a sustain electrode driving board, a scan electrode driving board, and the like. Many integrated circuit modules and switching elements are mounted on the various boards.

The sustain electrode driving board and the scan electrode driving board may have switching elements or integrated circuit modules that control sustain electrodes and scan electrodes of the PDP. The switching elements or the integrated circuit modules provide high-frequency sustain pulses, thereby generating heat. Accordingly, for PDP operation, the switching elements or the integrated circuit modules that control the sustain electrodes and the scan electrodes need to be maintained at a proper temperature.

However, large currents which flow in the respective integrated circuit modules provided on the circuit board assemblies result in a significant amount of heat being generated. If the heat is not sufficiently dissipated to the outside, the integrated circuit modules may cease to operate properly.

Some conventional plasma display devices have a space between the back cover and the circuit board assembly, the space being hermetically sealed. In order to dissipate the heat from the circuit board assembly, a ventilation section, such as a fan, is provided to cause forced convection. This structure works well to dissipate heat. However, the noise generated from the fan inconveniences the user.

On the other hand, other plasma display devices use heat sinks instead of a fan, allowing heat to be dissipated from the circuit board assemblies through free convection. In certain PDPs, a heat sink is provided at one side of a switching element or an integrated circuit module mounted on a circuit board assembly via lead lines, thereby forming a heat dissipating structure with a heat sink mounted on the circuit board assembly. According to this structure, a one-directional heat dissipating path is formed through which the heat from the switching element or the integrated circuit module created by driving the PDP is transferred to the heat sink and the transferred heat is dissipated through the convection reaction in the heat sink. However, this structure has a limit to the amount of heat dissipation of the integrated circuit module and the entire circuit board assembly.

SUMMARY OF THE INVENTION

A plasma display device is provided that diversifies a heat dissipating path of a switching element or an integrated circuit module of a circuit board assembly, thereby enhancing heat dissipation of the switching element or the integrated circuit module.

According to an exemplary embodiment of the present invention, a plasma display device includes a PDP, a chassis base on which the PDP is attached and supported, integrated circuit modules that are mounted on circuit board assembly disposed on an opposite side of the chassis base, and heat sinks, each heat sink being attached to the one side of each of the integrated circuit modules so as to dissipate heat therefrom. The heat sink is formed such that one end thereof extends to come in contact with the chassis base.

The integrated circuit module may be a surface mounted device (SMD) type or a dual in-line package (DIP) type. Further, the integrated circuit module may be a hybrid integrated circuit (HIC) type or an intelligent power module (IPM) type.

The integrated circuit module may be disposed at an edge of the circuit board assembly. The heat sink may have a first portion that is attached to the integrated circuit module, a second portion that is bent toward the chassis base from the first portion, and a third portion that extends from the second portion to come in contact with the chassis base. The first, second, and third portions of the heat sink may have a U-shape section, collectively.

The first portion may be attached to a top surface of the integrated circuit module inwardly and the third portion may be attached to the chassis base outwardly. Further, the first portion and the third portion may be connected to each other through the second portion to have a heat conduction structure.

The first and second portions may be planar and may further have heat dissipating fins. Further, the third portion may also be planar.

The heat sink may be attached to the chassis base via a heat dissipating pad. The heat dissipating pad may be disposed between the third portion of the heat sink having the first, second, and third portions and the corresponding chassis base.

Further, an auxiliary heat sink may be connected to one side of the heat sink that is attached to the one side of the integrated circuit module.

The heat sink and the auxiliary heat sink may be attached to each other via the heat dissipating pad. Accordingly, the heat transferred from the integrated circuit module to the heat sink is transferred to the auxiliary heat sink through the heat dissipating pad.

The other end of the auxiliary heat sink may come in contact with the chassis base. Accordingly, the heat transferred from the integrated circuit module to the auxiliary heat sink is transferred to the chassis base. The auxiliary heat sink and the chassis base may be attached to each other via the heat dissipating pad. Accordingly, the heat transferred to the auxiliary heat sink is transferred to the chassis base through the heat dissipating pad.

The integrated circuit module may be disposed at an edge of the circuit board assembly, such that the auxiliary heat sink can be freely attached to the one side of the heat sink.

The heat sink may be attached horizontally to the one side of the integrated circuit module and the auxiliary heat sink may be attached vertically to the one side of the heat sink. Therefore, a heat dissipating path of the heat generated in an intelligent power module can be diversified.

Further, the heat sink and the auxiliary heat sink may have the same shape. Therefore, parts of them can be used in common. Further, the auxiliary heat sink may have an L shape so as to be attached to the one side of the heat sink and the one side of the chassis base.

DETAILED DESCRIPTION

Figure 1:
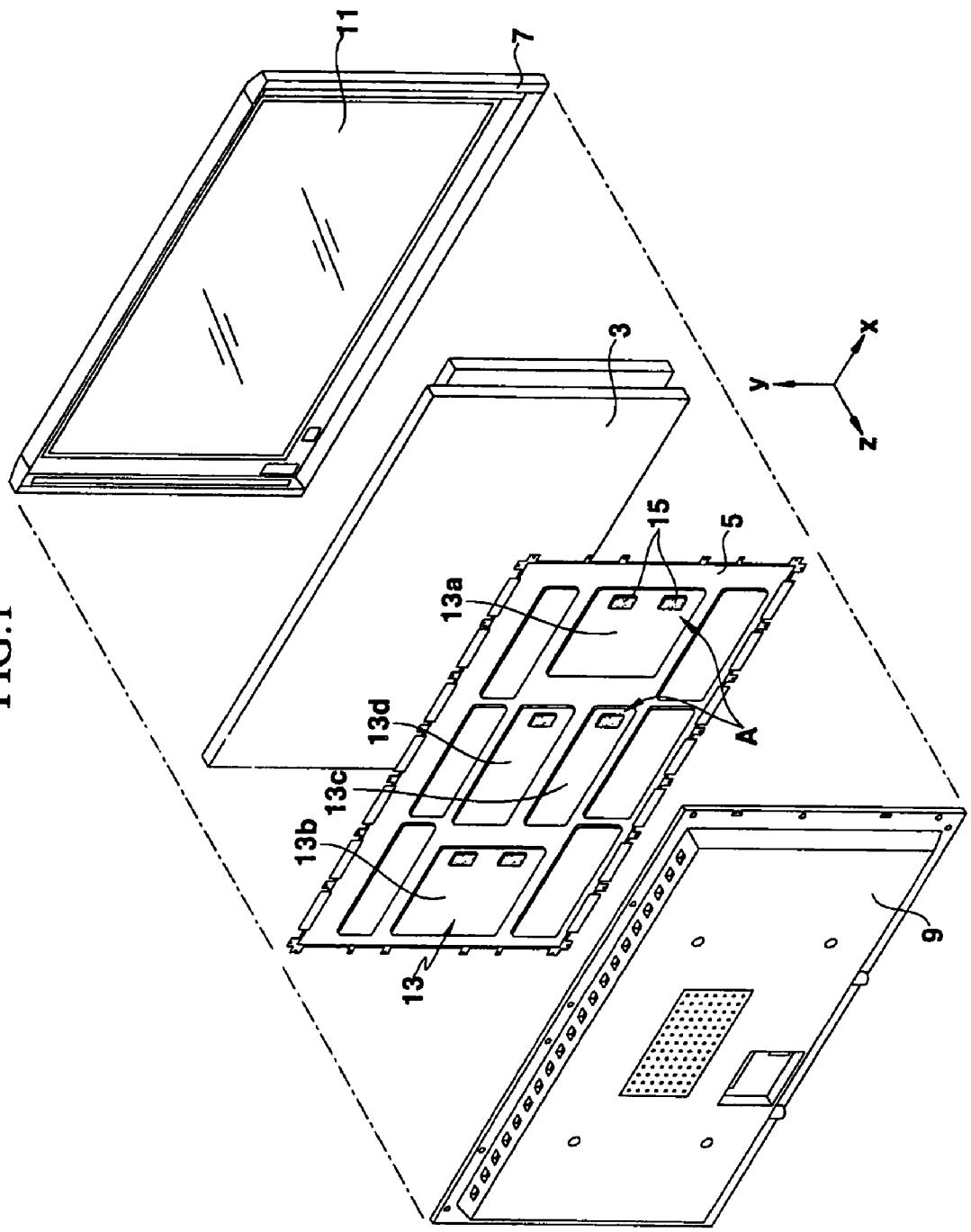
FIG. 1 is an exploded perspective view of a plasma display device according to an exemplary embodiment of the present invention.

Referring to FIG. 1, an exemplary embodiment of a plasma display device of the present invention has a PDP 3 that displays images and a chassis base 5 that is coupled to a surface of the PDP 3 that is opposite to a display surface of the PDP 3. Further, the plasma display device has a front cover 7 that is disposed over the PDP 3 and a back cover 9 that is disposed over the chassis base 5.

A heat dissipating sheet (not shown) may be arranged between the PDP 3 and the chassis base 5 to transfer heat generated in the PDP 3 to the chassis base 5. Further, a filter 11 may be mounted on the front cover 7 so as to shield electromagnetic waves emitted from the PDP 3.

Typically, the PDP 3 has a substantially quadrangular shape (in FIG. 1, a rectangular shape in which the length in the X direction is longer than the length in the Y direction). The chassis base 5 has a shape similar to the PDP 3 and is made of a material, such as aluminum, having superior heat conductivity.

The PDP 3 is attached to one side of the chassis base 5 to be supported thereon. Mounted on the other side of the chassis base 5 are a plurality of circuit board assemblies 13, each circuit board assembly having circuit elements required for driving the PDP 3. The circuit board assemblies 13 may be mounted on bosses (not shown) that are provided on a rear surface of the chassis base 5 by set screws (not shown).

The circuit board assemblies 13 mounted on the rear surface of the chassis base 5 may include a sustain electrode driving board 13a, a scan electrode driving board 13b, an image processing board 13c, a switching mode power supply (SMPS) board 13d, and the like. Typically, the various boards are constructed by mounting various types of integrated circuit modules 15, such as an SMD, a DIP, a HIC, and an IPM, on a printed circuit board through lead lines.

A heat dissipating structure of an integrated circuit module 15 according to an exemplary embodiment will be described with reference to FIGS. 2 and 3 which show an integrated circuit module 15 having an SMD-type switching element. The invention is not limited, however, to the integrated circuit module having an SMD-type switching element. For example, the invention can be applied to a DIP, HIC, or IPM-type integrated circuit module having been properly modified according to specific integrated circuit's structure.

As described above, the circuit board assembly 13 is fixed and mounted to the bosses 17 by the set screws 18. The integrated circuit modules 15 and other circuit elements are mounted on the circuit board assembly 13 to form a driving circuit.

Each integrated circuit module 15 generates heat as it drives the PDP 3, and thus the heat needs to be dissipated such that the integrated circuit module 15 is maintained at a proper temperature for continuous and natural driving. In order to dissipate the heat from the integrated circuit module 15, a heat sink 19 may be used. One side of the heat sink 19 of the present embodiment is attached to the integrated circuit module 15 and the other side thereof is attached to the chassis base 5, such that the integrated circuit module 15 is connected to the chassis base 5 through heat sink 19. The heat sink 19 may be attached to the integrated circuit module 15 by adhesives or an adhesive pad.

That is, the heat sink 19 is provided such that the integrated circuit module 15 and the chassis base 5 connected to each other form a heat conduction structure. For this reason, the heat generated in the integrated circuit module 15 is directly transferred to the one side of the heat sink 19 and then is transferred to the chassis base 5, such that the heat is dissipated. Further, the heat sink 19 itself has a structure in which the heat is dissipated through a convection effect. Therefore, a heat dissipating path of the integrated circuit module 15 is diversified, thereby efficiently enhancing heat dissipation. Accordingly, the heat sink 19 has superior conductivity as compared to conventional heat dissipation and is able to have a heat dissipating area as large as possible in a limited space.

The integrated circuit module 15, in which the heat is dissipated through the heat sink 19, is provided at many positions on a circuit board assembly 13. In order to enhance the advantage of the invention, the integrated circuit module 15 is in an exemplary embodiment provided at the edge of the circuit board assembly 13. Further, the heat sink 19 may be provided separately for each integrated circuit module 15 or may be provided commonly to adjacent integrated circuit modules 15. Further, in the design of the circuit board assembly 13, the integrated circuit module 15 may be arranged at the edge of the circuit board assembly 13.

The heat sink 19 of the present embodiment may be applied to all integrated circuit modules 15 provided on the circuit board assembly 13 or may be selectively applied to only the integrated circuit modules 15 which are provided at the edge of the circuit board assembly 13.

Figure 3:
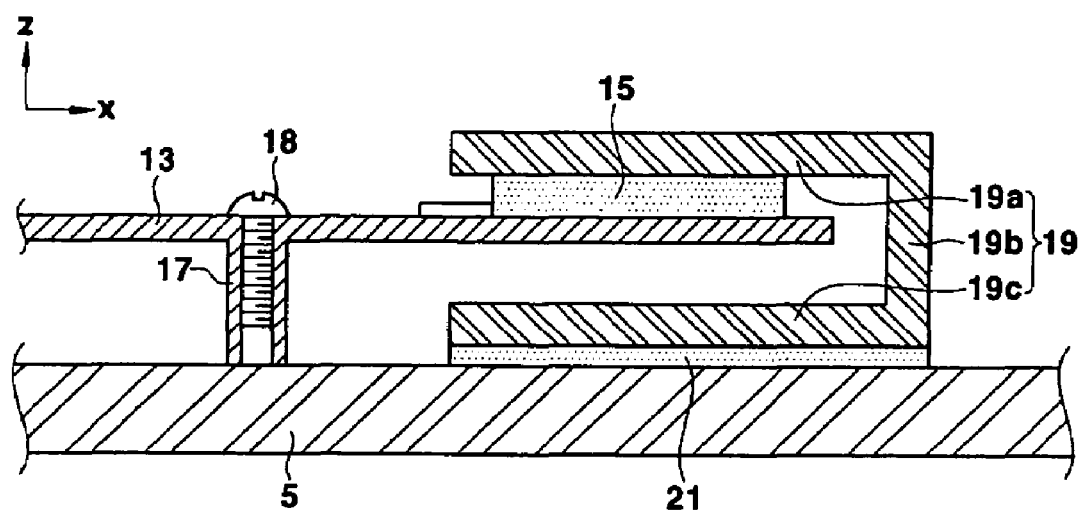
FIG. 3 is a cross-sectional view taken along the line III-III of FIG. 2.

As shown in FIG. 3, the heat sink 19 of the present embodiment has a U-shape section, including a first, second, and third portions 19a, 19b, and 19c. The heat sink 19 is provided on the integrated circuit module 15 which is disposed at the edge of the circuit board assembly 13. The first portion 19a is attached to the integrated circuit module 15 and the second portion 19b is bent toward the chassis base 5 from the first portion 19a. Further, the third portion 19c is formed integrally with the second portion 19b and is bent horizontally to the first portion 19a to be attached to the chassis base 5.

More specifically, an inner surface of the first portion 19a of the heat sink 19 is attached to a top surface of the integrated circuit module 15 and an outer surface of the third portion 19c is attached to the chassis base 5. The second portion 19b connects the first portion 19a to the third portion 19c, thereby forming the heat conduction structure.

The first portion 19a is attached to the integrated circuit module 15 so as to make substantial contact with the entire top surface of the integrated circuit module. The third portion 19c is attached to the chassis base 5 so as to make substantial contact with the surface of the chassis base 5.

As such, the heat sink 19 having the first, second, third portions 19a, 19b, 19c, respectively, can be implemented in various shapes. When the integrated circuit module 15 is disposed at the edge of the circuit board assembly 13, the heat sink 19 may be in a U-shape section. With the heat sink 19, the heat dissipating area of the heat transferred from the integrated circuit module 15 is increased.

Figure 2:
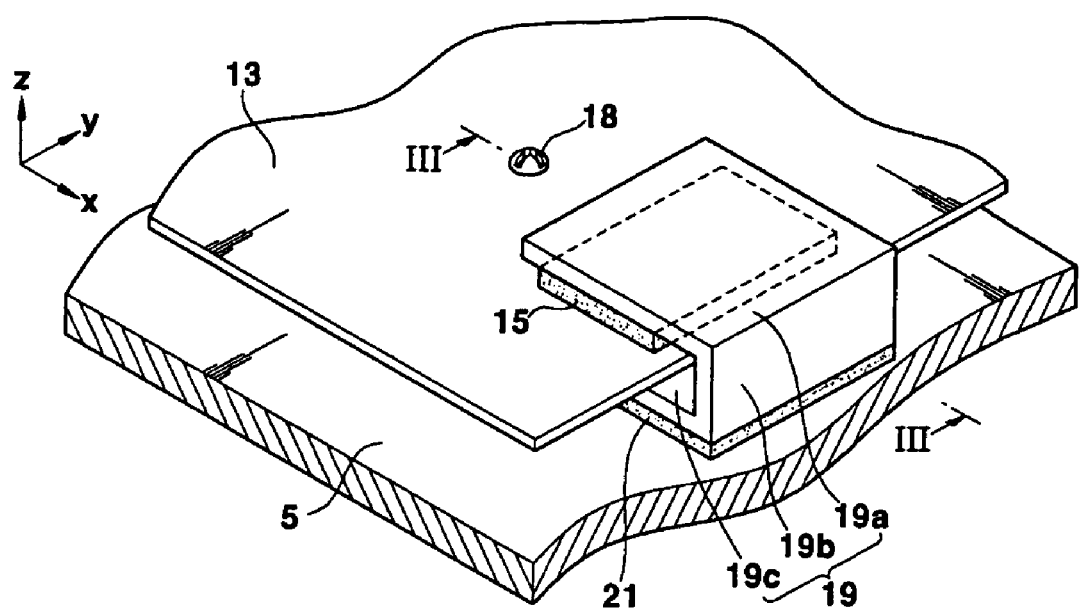
FIG. 2 is an expanded perspective view of portion A of FIG. 1.

Further, as shown in FIGS. 2 and 3, the first and second portions 19a and 19b are formed simply as plate shapes. With the plate-shaped first and second portions 19a, 19b, the heat dissipation of the integrated circuit module 15, depends on the heat conduction reaction to the chassis base 5 rather than the convection reaction.

On the other hand, the first and second portions 19a, 19b may have heat dissipating fins, such that the heat dissipation of the integrated circuit module 15 can be further enhanced.

Figure 4:
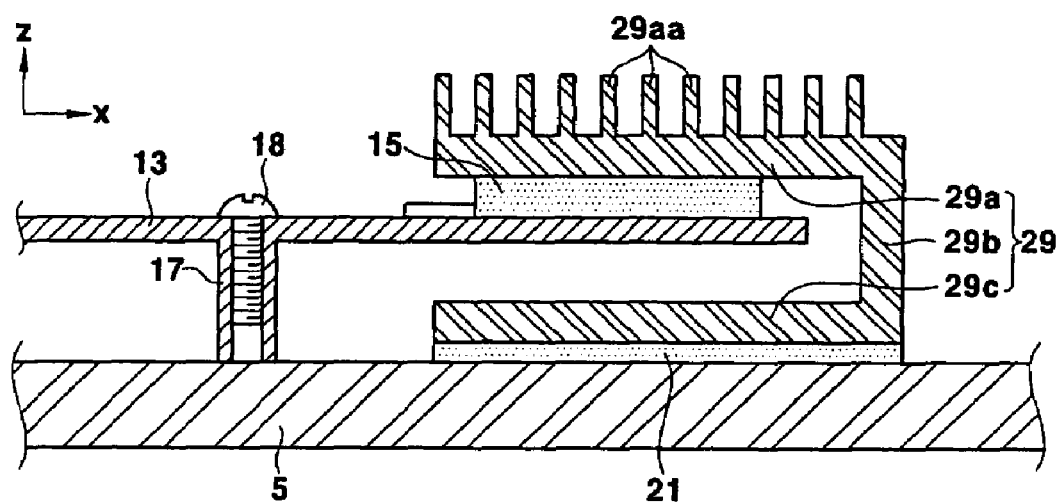
FIG. 4 is a cross-sectional view partially showing a plasma display device according to another exemplary embodiment of the present invention.
Figure 5:
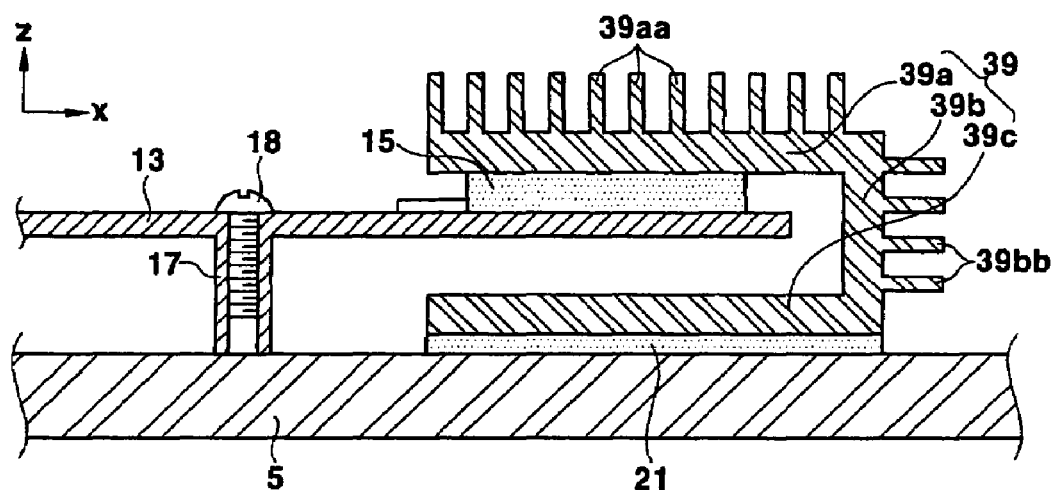
FIG. 5 is a cross-sectional view partially showing a plasma display device according to yet another exemplary embodiment of the present invention.

FIG. 4 is a cross-sectional view partially showing a plasma display device according to another exemplary embodiment of the invention. FIG. 5 is a cross-sectional view partially showing a plasma display device according to yet another exemplary embodiment of the invention.

Referring to FIG. 4, a heat sink 29 has a first portion 29a, a second portion 29b, and a third portion 29c. The first portion 29a has heat dissipating fins 29aa. Further, referring to FIG. 5, a heat sink 39 has a first portion 39a, a second portion 39b, and a third portion 39c. The first portion 39a and the second portion 39b have heat dissipating fins 39aa, 39bb, respectively.

The heat dissipating fins 29aa, 39aa, or 39bb increase the contact area of the heat sink 29 or 39 with the external surroundings. As a result, heat from the integrated circuit module 15 can be dissipated more effectively through the convection reaction, as well as through the heat conduction reaction of the heat sink 29 or 39. Consequently, since heat from the integrated circuit module 15 can be effectively dissipated, many elements provided on the circuit board assembly 13 can be replaced with one element. As a result, the number of parts can be reduced.

Unlike the first portion 29a or 39a and the second portion 29b or 39b, the third portion 29c or 39c is attached to the chassis base 5 and thus it is formed in a plate shape. The plate-shaped third portion 29c or 39c may make substantial contact with the chassis base 5.

In the above-described exemplary embodiments, the heat sinks 19, 29, 39 are directly attached to the chassis base 5. However, a heat dissipating pad 21 may be disposed between the heat sinks 19, 29, 39 and the chassis base 5 such that the heat sinks come in closer contact with the chassis base 5, thereby enhancing the heat conduction effect. When the heat sinks 19, 29, 39 have first portions 19a, 29a, 39a, second portions 19b, 29b, 39b, and third portions 19c, 29c, 39c, the heat dissipating pad 21 may be disposed between the third portion and the chassis base 5, thereby enhancing the heat conduction effect.

Figure 6:
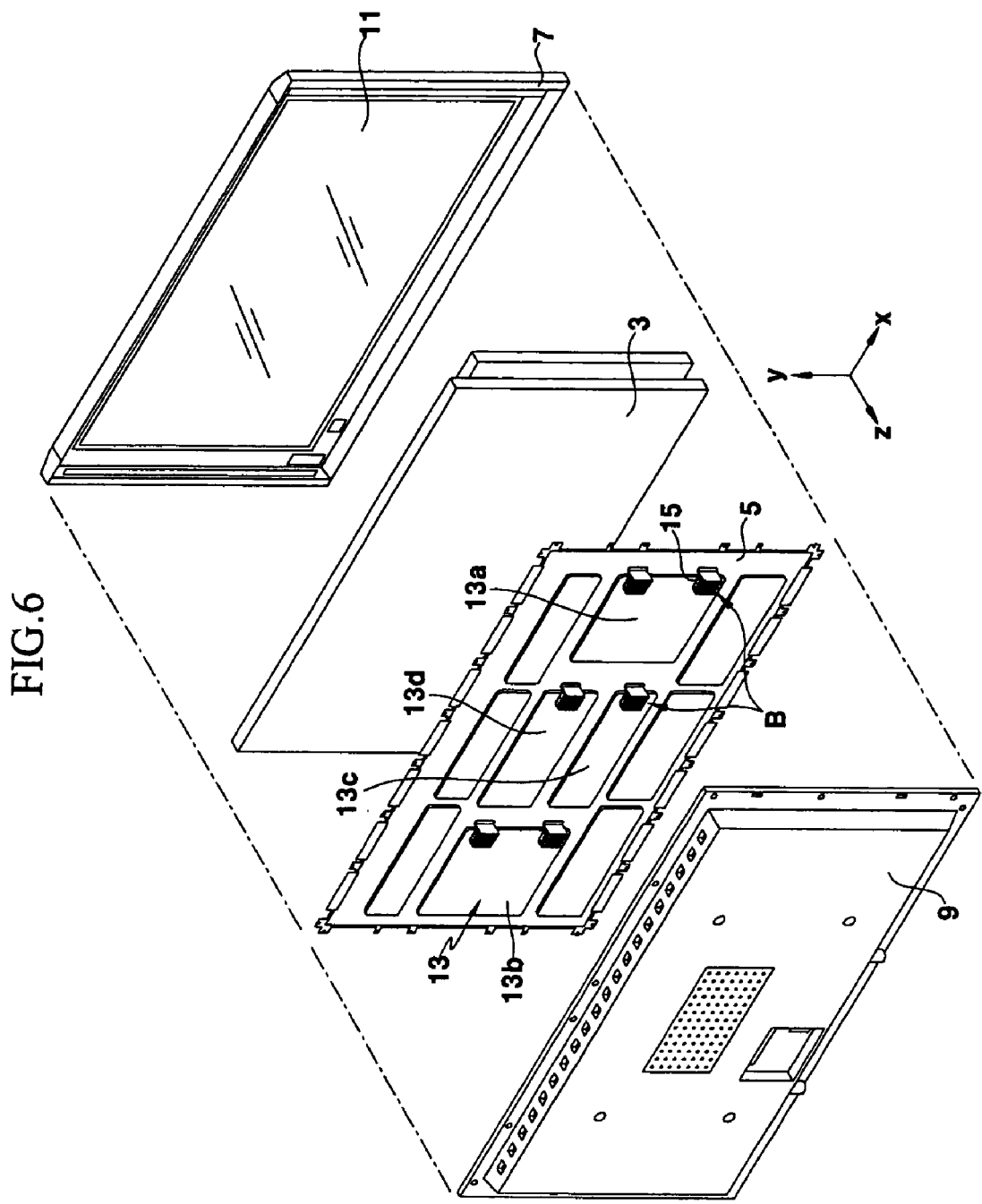
FIG. 6 is an exploded perspective view of a plasma display device according to still another exemplary embodiment of the present invention.
Figure 7:
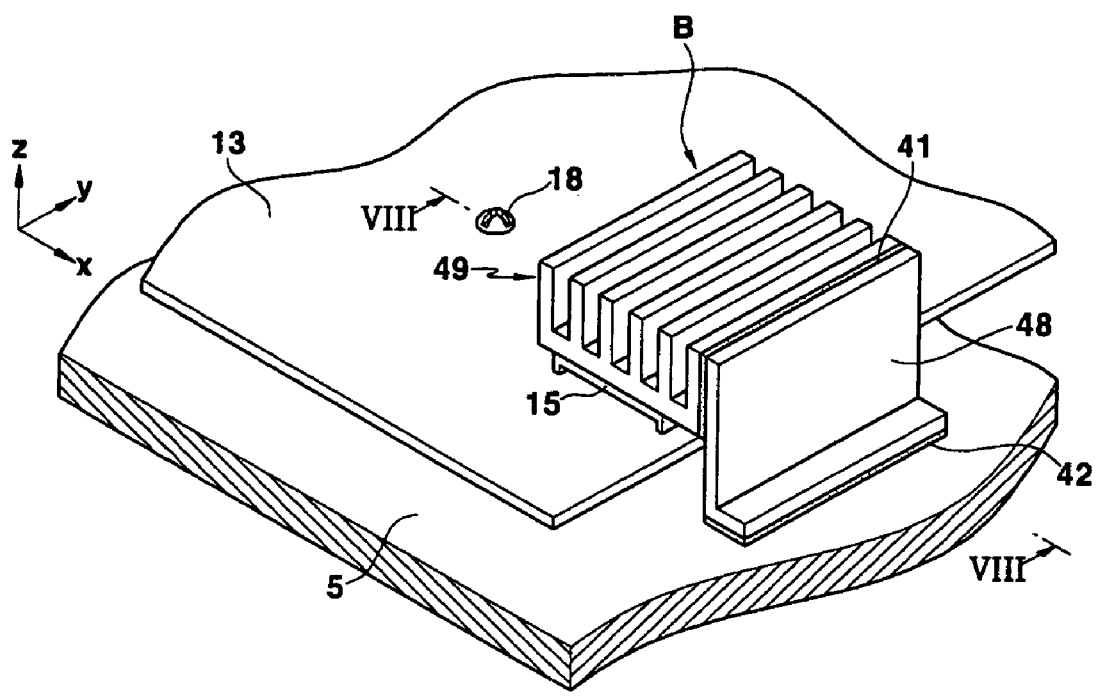
FIG. 7 is an expanded perspective view of portion B of FIG. 1.
Figure 8:
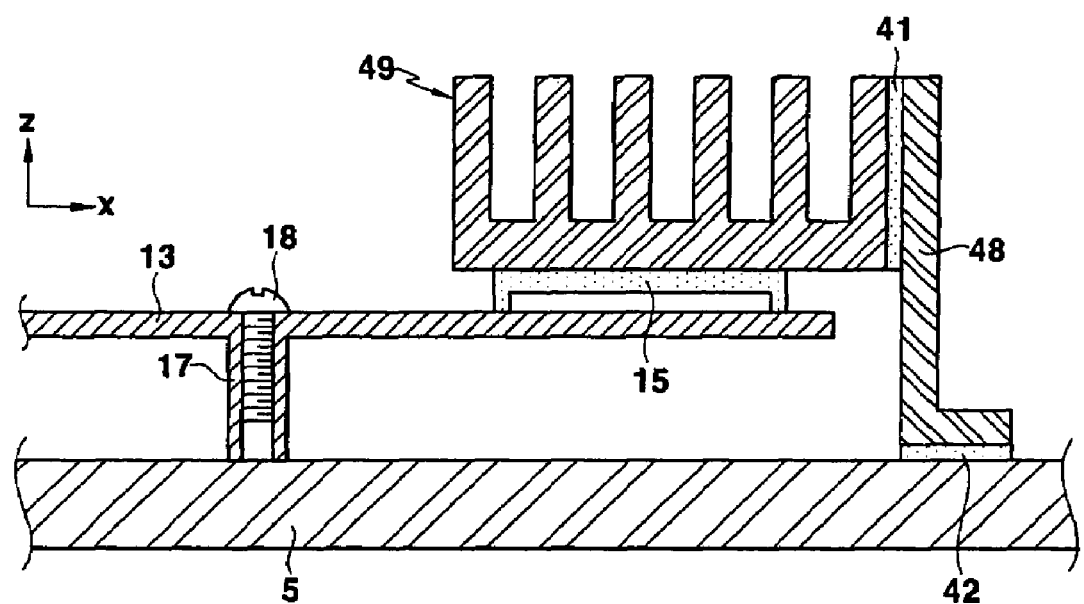
FIG. 8 is a cross-sectional view taken along the line VIII-VIII of FIG. 7.

FIG. 6 is an exploded perspective view of a PDP according to yet another exemplary embodiment of the invention. FIG. 7 is an expanded perspective view of portion B of FIG. 1. FIG. 8 is a cross-sectional view taken along the line VIII-VIII of FIG. 7.

When driving the PDP 3, the integrated circuit module 15 generates heat, and thus heat from the integrated circuit module is continuously dissipated to maintain the integrated circuit module at a proper temperature so as to drive the PDP for a long time. In the present embodiment, in order to dissipate the heat generated in the integrated circuit module 15, a heat sink 49 and an auxiliary heat sink 48 are used. The heat sink 49 is attached horizontally to one side of the integrated circuit module 15 and the auxiliary heat sink 48 is connected to one side of the heat sink 49, such that heat is transferred from the heat sink 49 to the auxiliary heat sink 48.

The heat sink 49 and the auxiliary heat sink 48 may be attached to each other via a heat dissipating pad 41 having superior heat conductivity. The heat dissipating pad 41 allows heat generated in the integrated circuit module 15 and transferred to the heat sink 49 to be dissipated from the heat sink 49 and transferred to the auxiliary heat sink 48 immediately. Thus, the heat can be dissipated through the auxiliary heat sink 48.

The auxiliary heat sink 48 with the heat dissipating pad 41 diversifies the heat dissipating path of the integrated circuit module 15, thereby enhancing heat dissipation efficiency of the integrated circuit module 15. Heat generated in the integrated circuit module 15 is dissipated through the convection effect in the heat sink 49 and the auxiliary heat sink 48 with the heat dissipating pad 41.

Further, one side of the auxiliary heat sink 48 may be connected to the heat sink 49 and the other side thereof may be connected to the chassis base 5. In this case, the auxiliary heat sink 48 and the chassis base 5 may be attached to each other via a heat dissipating pad 42. As described above, the heat dissipating pad 42 allows the heat transferred to the auxiliary heat sink 48 to be transferred to the chassis base 5 immediately. Thus, the heat dissipating path from the auxiliary heat sink 48 is diversified.

Heat generated in the integrated circuit module 15 is dissipated via the heat sink 49, the auxiliary heat sink 48, and the chassis base 5. With the heat dissipating pad 41, the heat generated in the integrated circuit module 15 is dissipated through the convection effect in the heat sink 49 and the auxiliary heat sink 48 and through the conduction effect to the chassis base 5. Finally, the heat is dissipated from the surface of the chassis base 5 through the convection effect.

The heat sink 49 may be attached horizontally to the one side of the integrated circuit module 15, thus maximizing the attachment area of the heat sink 49 to the integrated circuit module 15. This allows the heat generated in the integrated circuit module 15 to be transferred to the heat sink 49 immediately.

The auxiliary heat sink 48 is attached vertically to the one side of the heat sink 49, thereby maximizing the convection area. Thus, the heat transferred from the heat sink 49 is dissipated through the convection effect of the auxiliary heat sink 48 immediately. The auxiliary heat sink 48 may have the same shape as that of the heat sink 49 and thus the same parts may be used for both components.

The integrated circuit module 15 is provided at many positions on the circuit board assembly 13. In one exemplary embodiment, the integrated circuit module 15 is provided at an edge of the circuit board assembly 13. Further, the heat sink 49 and the auxiliary heat sink 48 may be applied to all integrated circuit modules 15 provided on the circuit board assembly 13 or may be selectively applied to only the integrated circuit modules 15 which are disposed at the edge of the circuit board assembly 13.

In one exemplary embodiment, the auxiliary heat sink 48 may have an L shape so as to be attached to the one side of the heat sink 49 and to the one side of the chassis base 5. The heat dissipating pad 41 may be disposed between the L-shaped auxiliary heat sink 48 and the heat sink 49, and the heat dissipating pad 42 may be disposed between the L-shaped auxiliary heat sink 48 and the chassis base 5. In this case, the heat may be dissipated while sequentially passing through the heat sink 49, the heat dissipating pad 41, the auxiliary heat sink 48, the heat dissipating pad 42, and the chassis base 5.

Figure 9:
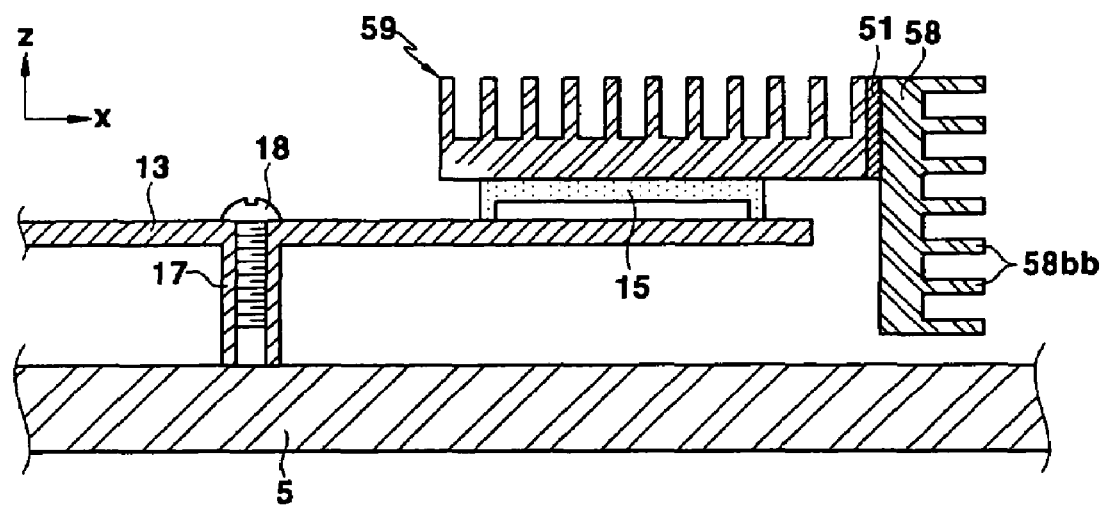
FIG. 9 is a cross-sectional view partially showing a plasma display device according to another exemplary embodiment of the present invention.

FIG. 9 is a cross-sectional view partially showing a plasma display device according to still another exemplary embodiment of the invention. The configuration and the operation thereof is substantially similar to that of the previously described embodiment.

In the present embodiment, an auxiliary heat sink 58 has the same shape as that of a heat sink 59. The auxiliary heat sink 58 may be attached to the one side of the heat sink 59 so as to increase the area for the convection reaction, thereby enhancing the heat dissipation of the integrated circuit module 15.

Therefore, this configuration may be applied to any structures, regardless of where the integrated circuit module 15 is mounted on the circuit board assembly 13.

In the present embodiment, the auxiliary heat sink 58 may be attached to the circuit board assembly 13 without contacting with the chassis base 5.

As such, according to an exemplary plasma display device of the invention, the integrated circuit module provided on the circuit board assembly is connected to the chassis base via the heat sink, and then the heat generated in the integrated circuit module is transferred to the chassis base via the heat sink to be dissipated. Further, through the convection effect by the heat dissipating fins having large areas, the heat dissipation of the integrated circuit module can be enhanced.

Further, the auxiliary heat sink is provided on the side of the heat sink, and thus the heat generated in the integrated circuit module is dissipated through the heat sink and the auxiliary heat sink. In addition, the one side of the auxiliary heat sink is attached to the chassis base, and thus the heat is also dissipated through the chassis base, thereby enhancing the heat dissipation of the integrated circuit module.

Exemplary embodiments of the invention have been described, but the invention is not limited to these embodiments. Various modifications can be made within the scope without departing from the subject matter of the invention read on the appended claims, the detailed description of the invention, and the accompanying drawings. These modifications also fall within the scope of the invention.

What is claimed is:

1. A display device comprising:
   a display panel;
   a chassis base to which the display panel is attached and supported;
   at least one integrated circuit module mounted on a circuit board assembly, the at least one integrated circuit module being disposed on the chassis base on a side opposite the display panel; and
   at least one heat sink comprising:
      a first portion attached to the at least one integrated circuit module and adapted to dissipate heat therefrom, and
      a second portion contacting the chassis base, substantially parallel to and spaced from the first portion;
   wherein the at least one integrated circuit module is between the first portion and the second portion.

2. The display device of claim 1, wherein the at least one integrated circuit module is selected from one of the group of a surface mounted device type, a dual in-line package type, a hybrid integrated circuit type and an intelligent power module type.

3. The display device of claim 1, wherein the display device is a plasma display device.

4. The display device of claim 1, wherein the at least one integrated circuit module is disposed at an edge of the circuit board assembly.

5. The display device of claim 1, wherein the at least one heat sink further comprises a middle portion connecting the first portion and the second portion.

6. The display device of claim 5, wherein the at least one heat sink has a U-shape.

7. The at least one heat sink of claim 5,
   wherein the first portion comprises an inner surface attached to a top surface of the at least one integrated circuit module.

8. The display device of claim 5, wherein the first portion, the second portion and the middle portion are planar.

9. The display device of claim 5, wherein at least one of the first portion and the middle portion have heat dissipating fins.

10. A display device comprising:
    a display panel;
    a chassis base to which the display panel is attached and supported;
    at least one integrated circuit module mounted on a circuit board assembly, the at least one integrated circuit module being disposed on the chassis base on a side opposite the display panel; and
    at least one heat sink comprising:
       a first portion attached to the at least one integrated circuit module and adapted to dissipate heat therefrom,
       a second portion contacting the chassis base, substantially parallel to and spaced from the first portion wherein the at least one integrated circuit module is located between the first portion and the second portion,
       a middle portion connecting the first portion and the second portion, and
    wherein the at least one heat sink is attached to the chassis base via a heat dissipating pad.

11. A heat sink for a display device, the display device having a display panel, a chassis base on which the display panel is attached and supported and at least one integrated circuit module mounted on a circuit board assembly, the circuit board assembly being disposed on the chassis base on a side opposite the display panel, the heat sink comprising:
    a first portion attachable to the at least one integrated circuit module;
    a second portion substantially parallel to and spaced from the first portion;

wherein the at least one integrated circuit module is locatable between the first portion and the second portion.

12. The heat sink of claim 11, further comprising a middle portion connecting the first portion and the second portion.

13. The heat sink of claim 11, wherein at least one of the first portion and the middle portion have heat dissipating fins.

14. A display device comprising:

a display panel;

a chassis base to which the display panel is attached and supported;

at least one integrated circuit module mounted on a circuit board assembly, the at least one integrated circuit module on the chassis base on a side opposite the display panel; and at least one heat sink attachable to the at least one integrated circuit module adapted to dissipate heat therefrom, the at least one heat sink comprising:

a first portion attached to the at least one integrated circuit module;

a second portion extending toward the chassis base from the first portion; and a third portion extended from the second portion to contact the chassis base;

wherein the at least one heat sink has one end extended to contact the chassis base;

wherein the at least one heat sink is attached to the chassis base via a heat dissipating pad; and wherein the heat dissipating pad is between the third portion of the at least one heat sink and the chassis base.

* * * * *